United States Patent
Kim et al.

(10) Patent No.: US 9,773,997 B2
(45) Date of Patent: Sep. 26, 2017

(54) ADHESIVE COMPOSITION AND DISPLAY DEVICE

(71) Applicants: SAMSUNG DISPLAY CO., LTD., Yongin-si, Gyeonggi-do (KR); Seoul National University R&DB Foundation, Seoul (KR)

(72) Inventors: Youngkwan Kim, Seoul (KR); Hyunjoong Kim, Seoul (KR); Donghun No, Cheongju-si (KR); Jiwon Park, Seoul (KR); Sangeun Moon, Suwon-si (KR); Jonggyu Lee, Seoul (KR)

(73) Assignees: Samsung Display Co., Ltd., Yongin-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/212,166

(22) Filed: Jul. 15, 2016

(65) Prior Publication Data
US 2017/0025485 A1    Jan. 26, 2017

(30) Foreign Application Priority Data
Jul. 20, 2015 (KR) .................. 10-2015-0102489

(51) Int. Cl.
*H01L 51/52* (2006.01)
*H01L 27/32* (2006.01)
*C09J 133/14* (2006.01)
*C09J 133/06* (2006.01)

(52) U.S. Cl.
CPC ........ *H01L 51/5237* (2013.01); *C09J 133/06* (2013.01); *H01L 27/3244* (2013.01); *H01L 51/5284* (2013.01)

(58) Field of Classification Search
CPC ............. H01L 27/3244; H01L 27/3248; H01L 27/3272; H01L 51/5237; H01L 51/524; H01L 51/5246; C09J 133/14; C09J 133/00; C09J 133/02; C09J 133/04
See application file for complete search history.

(56) References Cited

U.S. PATENT DOCUMENTS

| | | |
|---|---|---|
| 8,362,112 B2 | 1/2013 | Birkett et al. |
| 9,090,765 B2 * | 7/2015 | Schall ............ C08F 20/10 |
| 9,303,842 B2 * | 4/2016 | Cheon ............ F21V 11/00 |
| 2013/0201575 A1 * | 8/2013 | Cheon ............ F21V 11/00 359/893 |
| 2014/0221573 A1 * | 8/2014 | Schall ............ C08F 20/10 525/222 |

FOREIGN PATENT DOCUMENTS

| | | |
|---|---|---|
| KR | 10-1993-0021662 A | 11/1993 |
| KR | 10-2009-0023318 A | 3/2009 |
| KR | 10-2012-0014915 A | 2/2012 |
| KR | 10-2014-0017509 A | 2/2014 |

* cited by examiner

*Primary Examiner* — Nikolay Yushin
(74) *Attorney, Agent, or Firm* — Lewis Roca Rothgerber Christie LLP

(57) ABSTRACT

An adhesive composition includes: a binder component; a photo-initiator component; and an anaerobic-initiator component. The binder component includes a monomer, an oligomer, and a plasticizer; the photo-initiator component includes a photo-radical initiator and a photo-base generator (PBG); and the anaerobic-initiator component includes a metal reactive initiator, an accelerator, and an inhibitor.

19 Claims, 5 Drawing Sheets

ADHESIVE COMPOSITION AND DISPLAY DEVICE

CROSS-REFERENCE TO RELATED APPLICATION

This application claims priority to and the benefit of Korean Patent Application No. 10-2015-0102489, filed on Jul. 20, 2015, with the Korean Intellectual Property Office (KIPO), the disclosure of which is incorporated herein in its entirety by reference.

BACKGROUND

1. Field

Aspects of embodiments of the present invention relate to an adhesive composition and a display device manufactured utilizing the adhesive composition.

2. Description of the Related Art

Display devices are categorized (e.g., classified) into liquid crystal display ("LCD") devices, organic light emitting diode ("OLED") display devices, plasma display panel ("PDP") devices, electrophoretic display ("EPD") devices, and/or the like, based on a light emitting scheme thereof.

In general, a display device includes a display panel for displaying an image and a window for protecting the display panel, and the display panel and the window are attached to each other utilizing an adhesive layer. The adhesive layer may be formed through photo-curing of an adhesive composition.

In order to reduce or prevent the visibility of a non-display area of the display panel, a light blocking layer (or a black matrix) is disposed on an edge portion of the window. However, in a case where the adhesive composition is cured by light irradiation, light may not be adequately irradiated to a lower portion of the light blocking layer such that the adhesive composition in the lower portion of the light blocking layer may not be sufficiently cured, thus causing degradation in terms of adhesion in the lower portion of the light blocking layer.

Accordingly, there is a need to reduce or prevent degradation of adhesion in the lower portion of the blocking layer of the window.

It is to be understood that this background of the technology section is intended to provide useful background for understanding the technology, and as such, may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to an adhesive composition including both a photo-initiator component and an anaerobic-initiator component.

Further, aspects of embodiments of the present invention are directed to a display device including an adhesive layer including or being formed of the adhesive composition including both a photo-initiator component and an anaerobic-initiator component.

According to an embodiment of the present invention, an adhesive composition includes: a binder component; a photo-initiator component; and an anaerobic-initiator component. The binder component includes: a monomer in an amount of about 10 wt % to about 60 wt %; an oligomer in an amount of about 20 wt % to about 80 wt %; and a plasticizer in an amount of about 5 wt % to about 20 wt %, with respect to a total weight of the adhesive composition. The photo-initiator component includes: a photo-radical initiator in an amount of about 0.3 wt % to about 5 wt %; and a photo-base generator (PBG) in an amount of about 0.2 wt % to about 2 wt %, with respect to the total weight of the adhesive composition. The anaerobic-initiator component includes: a metal reactive initiator in an amount of about 0.1 wt % to about 2 wt %; an accelerator in an amount of about 0.2 wt % to about 2 wt %; and an inhibitor in an amount of about 0.1 wt % to about 1 wt %, with respect to the total weight of the adhesive composition.

The monomer may include at least one selected from the group consisting of: nonylphenyl carbitol acrylate, 2-hydroxy-3-phenoxypropyl acrylate, 2-ethylhexyl carbitol acrylate, 2-hydroxyethyl acrylate, N-vinyl pyrrolidone, 1,6-hexanedioldi(meth)acrylate, ethylene glycol di(meth)acrylate, neopentyl glycol di(meth)acrylate, triethylene glycol di(meth)acrylate, bis (acryloyl oxyethyl) ether, 3-methyl pentane diol di(meth)acrylate, ethyl hexyl oxetane, trimethylolpropane tri(meth)acrylate, ethoxylated trimethylolpropane tri(meth)acrylate, propoxylated trimethylolpropane tri(meth)acrylate, pentaerythritol tri(meth)acrylate, pentaerythritol tetra(meth)acrylate, dipentaerythritol penta (meth)acrylate, ethoxylated di pentaerythritol hexa(meth)acrylate, propoxylated dipentaerythritol hexa(meth)acrylate, dipentaerythritol hexa(meth)acrylate, isobornyl acrylate, n-octyl acrylate, tetrahydrofurfuryl acrylate, and 4-hydroxy butyl acrylate.

The monomer may include a compound having a cyclic ether group.

The oligomer may include at least one selected from the group consisting of:

urethane(meth)acrylate and ester(meth)acrylate, each having a weight-average molecular weight (Mw) of from about 5,000 to about 50,000.

The plasticizer may include at least one selected from the group consisting of: di-butyl-phthalate (DBP), di-2-ethylhexyl phthalate (DOP), di-isononyl phthalate (DINP), di-isodecyl phthalate (DIDP), and butyl benzyl phthalate (BBP).

The photo-base generator may react to light having a wavelength of from about 240 nm to about 385 nm to thereby generate a basic group.

The photo-base generator may include at least one selected from the group consisting of: a carbamate compound, an α-amino ketone compound, a quaternary ammonium compound, an amino cyclo propenone compound, an o-acyloxime compound, and 2-(9-oxoxanthen-2-yl) propionic acid 1,5,7-triazabicyclo [4,4,0]dec-5-ene salt.

The accelerator may include saccharin and N,N-dimethyl-p-toluidine (DMPT).

The metal reactive initiator may include at least one selected from the group consisting of: cumene hydroperoxide, t-butyl hydroperoxide, di-t-butyl hydroperoxide, methylethylketone peroxide, dicumyl peroxide, 2,5-dimethylhexyl-2,5-dihydro peroxide, diisopropylbenzene hydroperoxide, t-butyl benzoate, and t-butylperoxy acetate.

The inhibitor may include at least one selected from the group consisting of: 1,2,3,4-tetrahydroquinoline, hydroquinone, methyl hydroquinone, hydroquinone monomethyl ether, naphthoquinone, penanthraquinone, anthraquinone, benzoquinone, catechol, t-butylcatechol, 2,6-di-t-butyl-p-cresol, 2,6-di-t-butyl-4-methylphenol, phenothiazine, picrin acid phenothiazine, and hydroxy diphenylamine.

The anaerobic-initiator component may further include a chelate in an amount of about 0.05 wt % to about 0.5 wt % with respect to the total weight of the adhesive composition.

According to another embodiment of the present invention, a display device includes: a display panel; an adhesive layer on the display panel; and a window on the adhesive layer. The adhesive layer includes an adhesive polymer resin, a photo-initiator component, and an anaerobic-initiator component. The photo-initiator component includes a photo-radical initiator and a photo-base generator. The anaerobic-initiator component includes a metal reactive initiator, an accelerator, and an inhibitor. The window includes: a transparent substrate having a display area and a non-display area; a light blocking layer in the non-display area of the transparent substrate; and a metal layer in the non-display area of the transparent substrate, the metal layer contacting the adhesive layer.

The metal layer may be on the light blocking layer.

The metal layer may include at least one of iron (Fe) and copper (Cu).

The metal layer may include a coating resin and a metal element dispersed in the coating resin.

The adhesive layer may include a photo-curing portion corresponding to the display area of the transparent substrate and an anaerobic-curing portion corresponding to the non-display area of the transparent substrate.

The photo-curing portion may include the adhesive polymer resin and the anaerobic-initiator component dispersed in the adhesive polymer resin.

The adhesive polymer resin of the photo-curing portion may include a polymer moiety and a radical group of the photo-radical initiator bonded to the polymer moiety.

The anaerobic-curing portion may include the adhesive polymer resin and the photo-initiator component dispersed in the adhesive polymer resin.

The adhesive polymer resin of the anaerobic-curing portion may include a polymer moiety and a radical group of the metal reactive initiator bonded to the polymer moiety.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Hereinafter, embodiments of the present invention will now be described in more detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

All terminologies utilized herein are merely utilized to describe embodiments of the inventive concept and may be modified according to the relevant art and the intention of an applicant. Therefore, the terms utilized herein should be interpreted as having a meaning that is consistent with their meanings in the context of the present disclosure, and is not intended to limit the invention.

In the drawings, certain elements or shapes may be simplified or exaggerated to better illustrate embodiments of the present invention, and other elements present in an actual product may also be omitted. Thus, the drawings are intended to facilitate the understanding of the present invention. Like reference numerals refer to like elements throughout the specification.

In addition, when a layer or element is referred to as being "on" another layer or element, the layer or element may be directly on the other layer or element, or one or more intervening layers or elements may be interposed therebetween.

A first exemplary embodiment of the present invention provides an adhesive composition.

The adhesive composition according to the first exemplary embodiment includes a binder component, a photo-initiator component, and an anaerobic-initiator component.

The binder component includes: a monomer in an amount of about 10 wt % to about 60 wt %; an oligomer in an amount of about 20 wt % to about 80 wt %; and a plasticizer in an amount of about 5 wt % to about 20 wt %, with respect to the total weight of the adhesive composition. The photo-initiator component includes: a photo-radical initiator in an amount of about 0.3 wt % to about 5 wt %; and a photo-base generator (PBG) in an amount of about 0.2 wt % to about 2 wt %, with respect to the total weight of the adhesive composition. The anaerobic-initiator component includes: a metal reactive initiator in an amount of about 0.1 wt % to about 2 wt %; an accelerator in an amount of about 0.2 wt % to about 2 wt %; and an inhibitor in an amount of about 0.1 wt % to about 1 wt %, with respect to the total weight of the adhesive composition.

The monomer, one of the binder components, may utilize a monofunctional monomer and/or a polyfunctional monomer.

The monofunctional monomer may include nonylphenyl carbitol acrylate, 2-hydroxy-3-phenoxypropyl acrylate, 2-ethylhexyl carbitol acrylate, 2-hydroxyethyl acrylate, N-vinylpyrrolidone, and/or the like.

The polyfunctional monomer having two or more reactive groups may include 1,6-hexanediol di(meth)acrylate, ethylene glycol di(meth)acrylate, neopentyl glycol di(meth)acrylate, triethylene glycol di(meth)acrylate, bis (acryloyl oxyethyl) ether, 3-methyl pentanediol di(meth)acrylate, ethyl hexyl oxetane, trimethylolpropane tri(meth)acrylate, ethoxylated trimethylolpropane tri(meth)acrylate, propoxylated trimethylolpropane tri(meth)acrylate, pentaerythritol tri(meth)acrylate, pentaerythritol tetra(meth)acrylate, dipentaerythritol penta(meth)acrylate, ethoxylated dipentaerythritol hexa(meth)acrylate, propoxylated dipentaerythritol hexa(meth)acrylate, dipentaerythritol hexa(meth)acrylate, isobornyl acrylate, n-octyl acrylate, tetrahydrofuryl acrylate, 4-hydroxy butyl acrylate, and/or the like.

Among the aforementioned examples, the monomer, for example, may utilize trimethylolpropane triacrylate (TMPTA) represented by the following Chemical Formula 1.

Chemical Formula 1

In addition, the monomer may utilize a compound having a cyclic ether group, for example, ethyl hexyl oxetane (EHOX) represented by the following Chemical Formula 2.

Chemical Formula 2

According to the first exemplary embodiment, "(meth)acrylate" may refer to one of acrylate and methacrylate, or may refer to both of them.

The monomer may be utilized solely or in a combination of two or more kinds thereof.

The monomer may be in an amount of about 10 wt % to about 60 wt % with respect to the total weight of the adhesive composition. In a case where the amount of the monomer is in a range of about 10 wt % to about 60 wt %, curing of the adhesive composition by light exposure may be readily performed, and anaerobic-curing reaction may be readily performed. In a case where the amount of the monomer is less than about 10 wt %, the efficiency of curing may decrease. On the other hand, in a case where the amount of the monomer is more than about 60 wt %, the rigidity of the adhesive layer formed through curing of the adhesive composition may deteriorate.

The oligomer may utilize at least one of urethane(meth)acrylate and ester(meth)acrylate, each having a weight-average molecular weight (Mw) ranging from about 5,000 to about 50,000.

In a case where the average molecular weight (Mw) of the oligomer is more than about 50,000, adhesion of the adhesive composition adhering to an adherent is relatively low at an interface, and white turbidity may occur in a high temperature and high humidity environment. In a case where the weight-average molecular weight (Mw) of the oligomer is less than about 5,000, it may be difficult for the adhesive composition to maintain a solid state at room temperature. In the first exemplary embodiment, "weight-average molecular weight (Mw)" refers to an average molecular weight measured by gel permeation chromatography (GPC) based on polystyrene standards.

According to the first exemplary embodiment, the oligomer, for example, may utilize urethane(meth)acrylate. The urethane(meth)acrylate, for example, may be formed by reacting a polyol compound having two or more hydroxyl groups in the molecule, a compound having two or more isocyanate groups in the molecule, and (meth)acrylate having one or more hydroxyl groups in the molecule.

The polyol compound having two or more hydroxyl groups in the molecule may include, for example, polyether polyol, polyester polyol, caprolactone diol, bisphenol polyol, polyisoprene polyol, hydrogenated polyisoprene polyol, polybutadiene polyol, hydrogenated polybutadiene polyol, castor oil polyol, and/or polycarbonate diol, which may be utilized solely or in a combination of two or more thereof.

The compound having two or more isocyanate groups in the molecule may include, for example, aromatic polyisocyanate, alicyclic polyisocyanate, and/or aliphatic polyisocyanate, which may be utilized solely or in a combination of two or more thereof.

The (meth)acrylate having at least one hydroxyl group in the molecule may include, for example, mono(meth)acrylate of dihydric alcohols, such as ethylene glycol, propylene glycol, 1,3-propanediol, 1,3-butanediol, 1,4-butanediol, and/or polyethylene glycol; mono(meth)acrylate of trihydric alcohols, such as trimethylolethane, trimethylolpropane, and/or glycerin; and/or di(meth)acrylate, which may be utilized solely or in a combination of two or more thereof.

The oligomer may be in an amount of about 20 wt % to about 80 wt % with respect to the total weight of the adhesive composition. In a case where the amount of the oligomer is in a range of about 20 wt % to about 80 wt %, the adhesive composition may be readily cured, and the adhesive layer formed through curing of the adhesive composition may have suitable rigidity and flexibility.

The plasticizer improves the plastic workability of the adhesive composition, and imparts flexibility to the adhesive layer formed of the adhesive composition. The plasticizer may serve functions similar to those performed by a solvent, but has a greater molecular weight and lower volatility as compared to the solvent.

The plasticizer may include, for example, a phthalic acid ester plasticizer, a trimellitic acid ester plasticizer, a phosphoric acid ester plasticizer, an epoxy-based plasticizer, a polyester plasticizer, an aliphatic acid ester plasticizer, and/or a chlorinated paraffin plasticizer.

For example, the plasticizer may include at least one selected from: di-butyl-phthalate (DBP), di-2-ethylhexyl phthalate (DOP), di-isononyl phthalate (DINP), di-isodecyl phthalate (DIDP), and butyl benzyl phthalate (BBP).

In addition to that (the above described example plasticizers), tri-ethylhexyl trimellitate (TOTM), tri-isononyl trimellitate (TINTM), tri-iso decyl trimellitate (TIDTM), tri-cresyl phosphate (TCP), tri-2-ethylhexyl phosphate (TOP), cresyl diphenyl phosphate (CDP), triaryl phosphate, epoxidized soybean oil (ESO), epoxidized linseed oil (ELO), polyester having a low polymerization level of a weight-average molecular weight (Mw) ranging from about 1,000 to about 8,000, di-2-ethylhexyl adipate (DOA), di-2-ethylhexyl azelate (DOZ), and/or di-isodecyl adipate (DIDA) may be utilized as the plasticizer.

The plasticizer may be in an amount of about 5 wt % to about 20 wt % with respect to the total weight of the adhesive composition. In a case where the amount of the plasticizer is less than about 5 wt %, the workability of the adhesive composition may decrease. On the other hand, in a case where the amount of the plasticizer is more than about 50 wt %, the rigidity of the adhesive layer formed through curing of the adhesive composition may deteriorate.

The photo-initiator may be categorized (e.g., classified) into three groups based on the active species: a photo-radical generator, a photo-acid generator, and a photo-base generator (PBG). The photo-radical generator is a compound that absorbs active energy ray such as light to thereby generate a radical species, and has a wide range of applications. The photo-acid generator is a compound that absorbs active energy ray to thereby generate an acid, and the photo-base generator is a compound that absorbs active energy ray to thereby generate a base.

The photo-initiator component according to the first exemplary embodiment includes the photo-radical initiator and the photo-base generator (PBG).

The photo-radical initiator absorbs active energy ray such as ultraviolet ("UV") ray to thereby generate a radical. The radical generated from the photo-radical initiator reacts with the monomer and the oligomer to initiate the polymerization reaction of the binder component. Along with the polymerization reaction, cross-linking reaction may further occur among the monomer, the oligomer and the plasticizer, such that the adhesive composition may be cured through the polymerization reaction and cross-linking reaction. The adhesive composition is cured accordingly, and thereby an adhesive layer is formed.

The kind of the photo-radical initiator is not particularly limited, and any suitable photo-radical initiator, known in the pertinent art, which is applicable to the light-transmitting adhesive composition, may be utilized.

The photo-radical initiator may include, for example, an acetophenone-based photo-radical initiator, a benzoin-based photo-radical initiator, a benzophenone-based photo-radical initiator, a thioxantone-based photo-radical initiator, an acyl phosphine oxide-based photo-radical initiator, and/or the like.

The photo-radical initiator may be utilized solely, or two or more kinds thereof may be utilized in a combination therewith.

The acetophenone-based photo-radical initiator may include, for example, diethoxyacetophenone, 2-hydroxy-2-methyl-1-phenylpropan-1-one, benzyl dimethyl ketal, 4-(2-hydroxyethoxy)phenyl-(2-hydroxy-2-propyl)ketone, 1-hydroxycyclohexyl phenyl ketone, 2-methyl-2-morpholino (4-thiomethylphenyl) propan-1-one, 2-benzyl-2-dimethyl-amino-1-(4-morpholinophenyl) butanone, 2-hydroxy-2-methyl-1-4-(1-methylvinyl)phenyl]propanone, and/or the like.

The benzoin-based photo-radical initiator may include, for example, benzoin, benzoin methyl ether, benzoin ethyl ether, benzoin isopropyl ether, benzoin isobutyl ether, and/or the like.

The benzophenone-based photo-radical initiator may include, for example, benzophenone, methyl o-benzoyl benzoic acid, 4-phenyl benzophenone, 4-benzoyl'-4-methyl-diphenyl sulfide, 3,3',4,4'-tetra(t-butyl peroxy carbonyl) benzophenone, 2,4,6-trimethyl-benzophenone, 4-benzoyl-N,N-dimethyl-N-[2-(1-oxo-2-propenyloxy)ethyl]benzene meth-Nami bromide, (4-benzoyl-benzyl) trimethyl ammonium chloride, and/or the like.

The thioxantone-based photo-radical initiator may include, for example, 2-isopropyl thioxanthone, 4-isopropyl thioxanthone, 2,4-diethyl thioxanthone, 2,4-dichloro thioxanthone, 1-chloro-4-propoxy thioxantone, 2-(3-dimethyl-amino-2-hydroxy)-3,4-dimethyl-9H-thioxanthone-9-onemethochloride, and/or the like.

The acyl phosphine oxide-based photo-radical initiator may include, for example, bis(2,4,6-trimethylbenzoyl)-phenyl phosphine oxide, 2,4,6-trimethylbenzoyl-diphenyl phosphine oxide, 2,4,6-trimethylbenzoyl phenylethoxy phosphine oxide, and/or the like.

For example, the photo-radical initiator may utilize at least one selected from: Darocur1273™, Irgacure 651™, Irgacure 184™, Irgacure 907™, Irgacure 819™, and Darocur TPO™, each manufactured by Ciba-Geigy.

According to the first exemplary embodiment, the photo-radical initiator absorbs active energy ray having a wavelength of from about 240 nm to about 385 nm to thereby generate a radical. That is, the photo-radical initiator has a photo-sensitive area of a wavelength of from about 240 nm to about 385 nm.

The photo-radical initiator may be categorized (e.g., classified) into a short-wavelength initiator and a long-wavelength initiator based on the photo-sensitive area. For example, a photo-radical initiator absorbing active energy ray having a wavelength of about 300 nm or less to generate a radical is referred to as a "short-wavelength initiator", and a photo-radical initiator absorbing active energy ray having a wavelength of about 300 nm or more to generate a radical is referred to as a "long-wavelength initiator." According to the first exemplary embodiment, the short-wavelength initiator and the long-wavelength initiator may be mixed together to be utilized.

The photo-radical initiator may be in an amount of about 0.3 wt % to about 5 wt % with respect to the total weight of the adhesive composition. In a case where the amount of the photo-radical initiator is less than about 0.3 wt %, the photo-curing properties of the adhesive composition may deteriorate; and in a case where the amount of the photo-radical initiator is more than about 5 wt %, the rigidity of the adhesive layer formed through curing of the adhesive composition may decrease.

The photo-base generator (PBG) is a compound that absorbs active energy ray such as UV ray to generate a base. The base generated from the photo-base generator may serve as a polymerization initiator.

For example, the photo-base generator absorbs light such as visible ray or UV ray to generate amine. The amine reacts with the monomer or the oligomer to initiate the polymerization reaction and the curing reaction. In addition, the base generated by the photo-base generator reacts with a residual acid group in the adhesive layer to consume the residual acid group, thus reducing or preventing degeneration of the adhesive layer due to the acid group.

Suitable photo-base generator may include, for example, a carbamate compound, an α-amino ketone compound, a quaternary ammonium compound, an amino cyclo propenone compound, an o-acyloxime compound, and/or the like, which may be utilized solely or in a combination of two or more kinds thereof.

Examples of the carbamate compound utilized as the photo-base generator may include one or more compounds represented by the following Chemical Formulas 3 to 8.

Chemical Formula 3

1-(2-anthraquinonyl)ethyl-1-piperidinecarboxylate

Chemical Formula 4

1-(2-anthraquinonyl) ethyl-1H-2-ethylimidazole-1-carboxylate

-continued

Chemical Formula 5

9-anthryl methyl-N,N-diethyl carbamate

Chemical Formula 6

9-anthryl methyl-1H-imidazole-1-carboxylate

Chemical Formula 7 bis [1-(2-anthraquinonyl) ethyl]-hexane-1,6-diyl bis carbamate

Chemical Formula 8 bis (9-anthryl methyl)-hexane-1,6-diyl bis carbamate

In addition, the α-amino ketone compound may include, for example, 1-phenyl-2-(4-morpholino benzoyl)-2-dimethylamino-butane, 2-(4-methylthio benzoyl)-2-morpholino propane, and/or the like.

The quaternary ammonium compound may include, for example, 1-(4-phenylthio phenacyl)-1-azonia-4-azabicyclo[2,2,2] octane tetraphenylborate, 5-(4-phenylthio phenacyl)-1-aza-5-azoniabicyclo [4,3,0]-5-nonene tetraphenylborate, 8-(4-phenylthio phenacyl)-1-aza-8-azoniabicyclo [5,4,0]-7-undecene-tetraphenylborate, and/or the like.

The aminocyclo propenone compound may include, for example, 2-diethyl amino-3-phenylcyclo propenone, 2-diethyl amino-3-(1-naphthyl) cyclopropenone, 2-pyrrolidinyl-3-phenyl cyclopropenone, 2-imidazolyl-3-phenyl cyclopropenone, 2-isopropyl amino-3-phenyl cyclopropenone, and/or the like.

The o-acyloxime compound may include, for example, a compound represented by the following Chemical Formula 9.

Chemical Formula 9

In Chemical Formula 9, each of $R_1$, $R_2$, and $R_3$ independently represents hydrogen (H), an alkyl group having 1 to 10 carbon atoms, an aryl group having 1 to 10 (e.g., 6 to 10) carbon atoms, or an aralkyl group having 1 to 10 (e.g., 7 to 10) carbon atoms, and at least one of $R_1$, $R_2$, and $R_3$ has an aryl group.

In addition, as a compound having a salt form, 2-(9-oxoxanthen-2-yl) propionic acid 1,5,7-triazabicyclo[4,4,0]dec-5-ene salt represented by the following Chemical Formula 10 (hereinafter, "salt represented by Chemical Formula 10") may be utilized as the photo-base generator.

Chemical Formula 10

The salt represented by Chemical Formula 10 may react to light having a wavelength of about 254 nm or light having a wavelength of about 365 nm to thereby generate 1,5,7-triazabicyclo[4,4,0]dec-5-ene ("TBD"), which is a strong base. The TBD may be amplified in the presence of a base amplifier, and the TBD may accelerate polymerization and cross-linking of the monomer as illustrated in Reactive Formula 1.

Reactive Formula 1

The photo-base generator may be in an amount of about 0.2 wt % to about 2 wt % with respect to the total weight of the adhesive composition. In a case where the amount of the photo-base generator is less than about 0.2 wt %, the photo-curing property of the adhesive composition may deteriorate, and it may be difficult to capture an acid group generated by the decomposition of the anaerobic-initiator component. On the other hand, in a case where the amount of the photo-base generator is more than about 2 wt %, coloring may occur in the adhesive layer.

The photo-initiator component may further include at least one of an amine compound and a carboxylic acid compound as an auxiliary photopolymerization initiator.

Examples of the amine compound may include: an aliphatic amine compound, such as triethanolamine, methyl diethanolamine, and/or triisopropanolamine; and/or an aromatic amine compound, such as methyl 4-dimethylamino benzoate, ethyl 4-dimethylamino benzoate, isoamyl 4-dimethylamino benzoate, 2-ethylhexyl 4-dimethylamino benzoate, benzoic acid 2-dimethylaminoethyl, N,N-dimethyl-para toluidine, 4,4'-bis (dimethylamino) benzophenone (i.e., Michler's ketone), 4,4'-bis (diethylamino) benzophenone, and/or the like.

Examples of the carboxylic acid compounds may include aromatic hetero acetic acid, such as phenylthio acetic acid, methylphenylthio acetic acid, ethyl phenylthio acetic acid, methyl ethyl phenylthio acetic acid, dimethyl phenyl thio acetic acid, methoxyphenylthio acetic acid, dimethoxyphenyl thio acetic acid, chlorophenylthio acetic acid, dichlorophenylthio acetic acid, N-phenylglycine, phenoxy acetic acid, naphthylthio acetic acid, N-naphthyl glycine, naphthoxy acetic acid, and/or the like.

The anaerobic-initiator component includes a metal reactive initiator, an accelerator, and an inhibitor.

The anaerobic-initiator component initiates the polymerization reaction by contacting a metal (e.g., a metal element), and although light irradiation is absent (e.g., there is no light irradiation), it allows the polymerization of a polymeric monomer and/or an oligomer to occur. In addition, the anaerobic-initiator component serves to reduce or prevent polymerization of the monomer (e.g., polymeric monomer) and/or the oligomer when the polymeric monomer and/or the oligomer contacts air and/or oxygen.

The metal reactive initiator reacts with metal to generate a radical, and the monomer or the oligomer may be polymerized by the radical.

According to the first exemplary embodiment, the metal reactive initiator may utilize an oxidative initiator. An example of the oxidative metal reactive initiator may include a peroxide-based initiator. The peroxide-based initiator (ROOH), for example, generates a radical (RO.) by the reaction exemplarily represented by the following Reaction Formula 2.

Reaction Formula 2

ROOH + Fe$^{2+}$ → RO• + Fe$^{3+}$ + OH$^-$
(prroxide) (metal ion)  (initial radical)

The radical (RO.) generated in such a manner may generate a monomer radical by the reaction exemplarily represented by the following Reaction Formula 3 to initiate the polymerization of the monomer.

Reaction Formula 3

(monomer)  (monomer radical)

The metal reactive initiator may include, for example, cumene hydroperoxide, t-butyl hydroperoxide, di-t-butyl hydroperoxide, methylethylketone peroxide, dicumyl peroxide, 2,5-dimethyl-hexyl-2,5-di hydroperoxide, diisopropylbenzene hydroperoxide, t-butyl benzoate, t-butylperoxy acetate, and/or the like, which may be utilized solely or in a combination of two or more kinds thereof.

The metal reactive initiator may be in an amount of about 0.1 wt % to about 2 wt % with respect to the total weight of the adhesive composition. In a case where the amount of the metal reactive initiator is less than about 0.1 wt %, the efficiency of anaerobic polymerization reaction may decrease. In a case where the amount of the metal reactive initiator is more than about 2 wt %, stability in storage of the adhesive composition may decrease, and in the process of curing the adhesive composition, an excessive amount of the radical may be generated such that an acid group may remain in the adhesive layer.

The accelerator serves to accelerate the initiation of polymerization of the metal reactive initiator.

According to the first exemplary embodiment, the accelerator may utilize saccharin and/or N,N-dimethyl-p-toluidine (DMPT).

The saccharin may be represented by the following Chemical Formula 11, and the N,N-dimethyl-p-toluidine (DMPT) may be represented by the following Chemical Formula 12.

Chemical Formula 11

Chemical Formula 12

The accelerator, for example, accelerates the reaction of the metal reactive initiator by the reaction exemplarily represented by the following Reaction Formula 4. In the Reaction Formula 4, the chemical compound (1) is saccharin, the chemical compound (2) is N,N-dimethyl-p-toluidine (DMPT), and the chemical compound (3) is cumene hydroperoxide, which is, the metal reactive initiator.

inhibitor is utilized so as to control the speed of the polymerization reaction. The inhibitor may be also referred to as a radical inhibitor or a polymerization inhibitor. The inhibitor reacts with the radical derived from the monomer to consume the radical, thus stopping the polymerization reaction.

According to the first exemplary embodiment, examples of the inhibitor may include 1,2,3,4-tetrahydroquinoline, hydroquinone, methyl hydroquinone, hydroquinone monomethyl ether, naphthoquinone, penanthraquinone, anthraquinone, benzoquinone, catechol, t-butylcatechol, 2,6-di-t-butyl-p-cresol, 2,6-di-t-butyl-4-methylphenol, phenothiazine, picrin acid phenothiazine, hydroxy diphenylamine, and/or the like, which may be utilized solely or in a combination of two or more kinds thereof.

Reaction Formula 4

The accelerator may be in an amount of about 0.2 wt % to about 2 wt % with respect to the total weight of the adhesive composition. In a case where the amount of the accelerator is less than about 0.2 wt %, the speed of polymerization initiation of the metal reactive initiator may decrease to lower the curing efficiency, and in a case where the amount of the accelerator is more than about 2 wt %, polymerization initiating reaction is excessively accelerated such that the rigidity of the adhesive layer may deteriorate.

The inhibitor controls the speed of anaerobic curing reaction.

In a case where the polymerization reaction is started by the metal reactive initiator, it is difficult to control the polymerization reaction that occurs consecutively. The The inhibitor may be in an amount of about 0.1 wt % to about 1 wt % with respect to the total weight of the adhesive composition. In a case where the amount of the inhibitor is less than about 0.1 wt %, it may be difficult to control the polymerization reaction and the storage stability may deteriorate, and in a case where the amount of the inhibitor is more than about 1 wt %, duration of the polymerization reaction may be lengthened and the adhesion strength may deteriorate.

In addition, the anaerobically curable component may further include chelate (e.g., a chelating ligand). The chelate reduce or prevents influx of metal ions into the adhesive layer (the metal ions that serves as a catalyst for the anaerobic curing reaction). The chelate may capture the metal ion.

The chelate may utilize a metal chelate agent, such as ethylenediamine tetra acetic acid and its sodium salt, acetyl acetone, and/or o-aminophenol, which may be utilized solely or in a combination of two or more kinds thereof.

The chelate may be in an amount of about 0.05 wt % to about 0.5 wt % with respect to the total weight of the adhesive composition. In a case where the amount of the chelate is less than about 0.05 wt %, the efficiency of capturing metal ions may decrease, and in a case where the amount of the chelate is more than about 0.5 wt %, the curing of the adhesive composition may be impeded.

The adhesive composition according to the first exemplary embodiment may further include an additive, where necessary. The additive may include, for example, a filler, a polymer compound, a dispersant, an adhesion accelerator, an antioxidant, a UV absorber, an anti-agglomeration agent, and/or the like.

Among the aforementioned additives, examples of the UV absorber may include 2-(3-tert-butyl-2-hydroxy-5-methylphenyl)-5-chlorobenzotriazole and/or alkoxy benzophenone. The UV absorber may facilitate the UV absorption of the adhesive composition.

In addition, the adhesive composition according to the first exemplary embodiment may further include a photo-sensitizer. The photo-sensitizer may serve to enhance the photo-sensitivity of the adhesive composition.

Hereinafter, the second exemplary embodiment of the present invention will be described with reference to FIGS. 1, 2, 3, and 4. In order to avoid repetition, descriptions with regard to configurations described in the foregoing will be omitted (e.g., will not be repeated).

Figure 1:
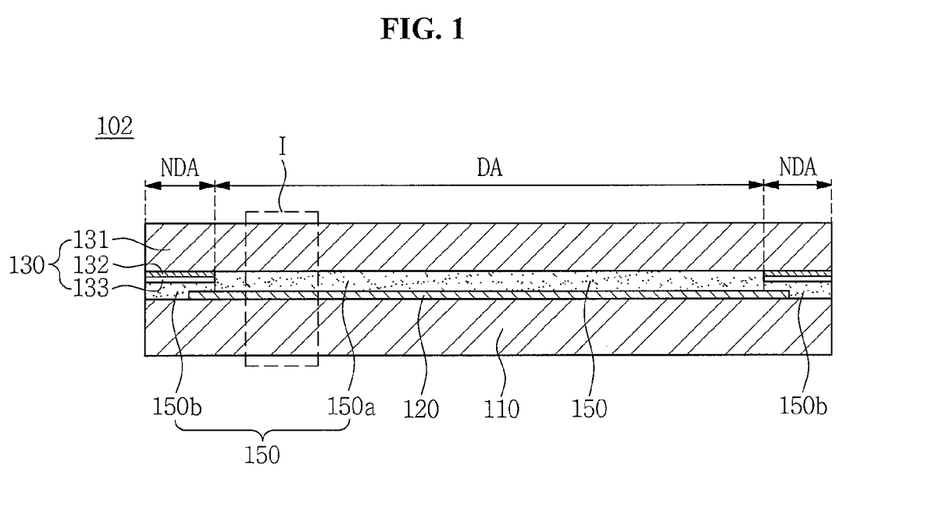
FIG. 1 is a cross-sectional view illustrating a display device according to an embodiment (e.g., a second exemplary embodiment)

FIG. 1 is a cross-sectional view illustrating a display device 102 according to the second exemplary embodiment. The display device 102 includes a display panel 110, a polarizer 120 on the display panel 110, an adhesive layer 150 on the display panel 110 and the polarizer 120, and a window 130 on the adhesive layer 150.

The display device 102 according to the second exemplary embodiment is an organic light emitting diode ("OLED") display device 102. Accordingly, the display panel 110 of FIG. 1 is an organic light emitting display panel. However, the second exemplary embodiment is not limited thereto, and the display device may be a liquid crystal display ("LCD") device and the display panel may be an LCD panel.

Figure 2:
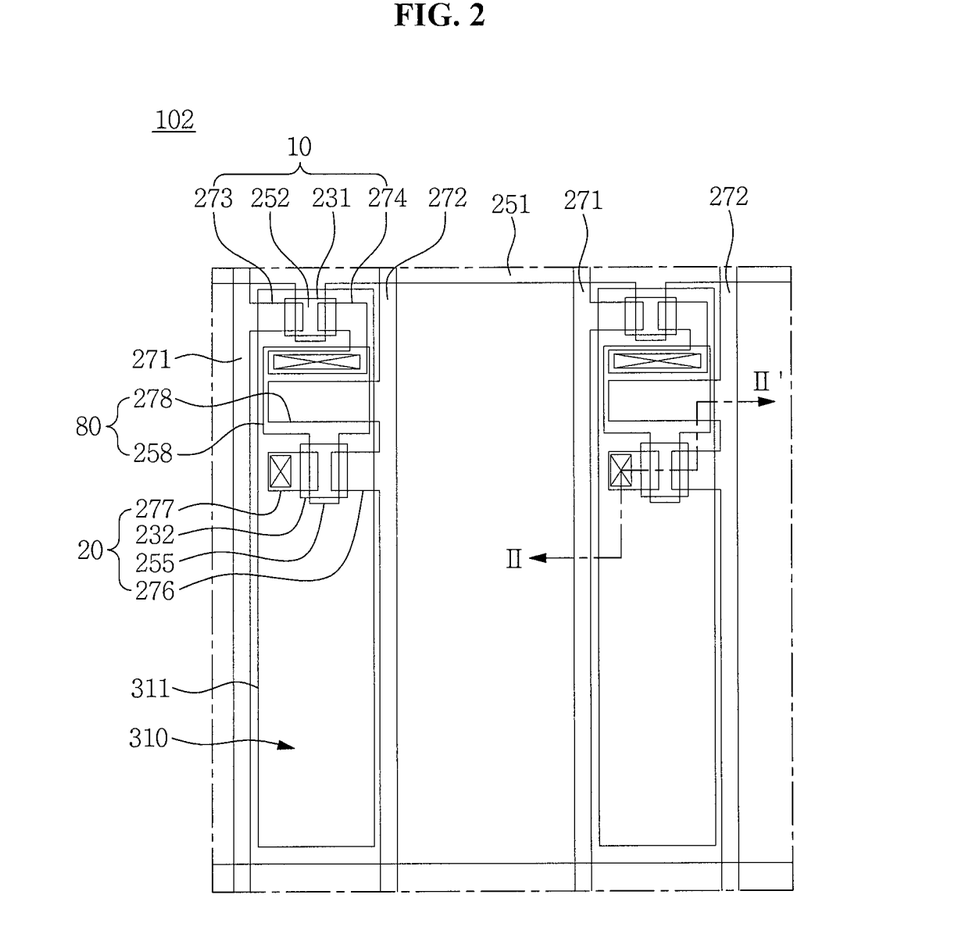
FIG. 2 is a plan view illustrating portion "I" of FIG. 1.
Figure 3:
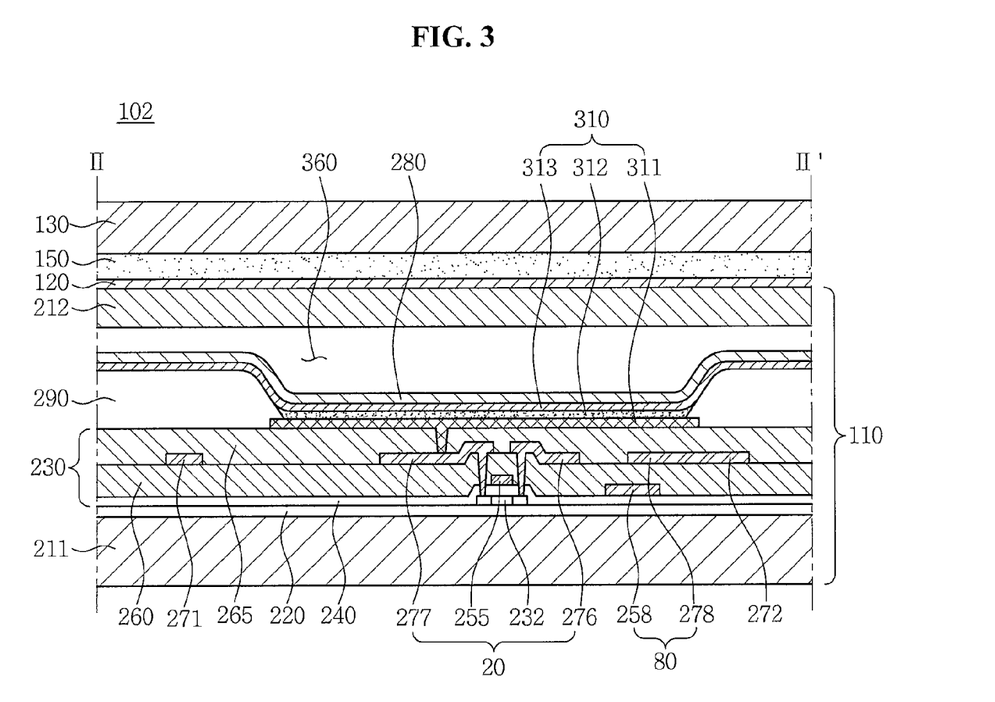
FIG. 3 is a cross-sectional view taken along the line "II-II" of FIG. 2.

FIG. 2 is a plan view illustrating portion "I" of FIG. 1, and FIG. 3 is a cross-sectional view taken along the line "II-II" of FIG. 2.

The display panel 110 of the OLED display device 102 according to the second exemplary embodiment includes a substrate 211, a driving unit 230, an OLED 310, and an encapsulation substrate 212.

The substrate 211 may include an insulating substrate including or being formed of glass, quartz, ceramic, plastic and/or the like. However, the second exemplary embodiment is not limited thereto, and the substrate 211 may be formed of a metal material such as stainless steel.

A buffer layer 220 is disposed on the substrate 211. The buffer layer 220 may include one or more layers selected from various suitable inorganic layers and organic layers. However, the buffer layer 220 may not be invariably necessary, and may be omitted (e.g., may not be included).

The driving unit 230 is disposed on the buffer layer 220. The driving unit 230 includes a plurality of thin film transistors (TFTs) 10 and 20, and drives the OLED 310. That is, the OLED 310 may display an image by emitting light based on a driving signal applied from the driving unit 230.

FIGS. 2 and 3 illustrate an active-matrix organic light emitting diode ("AMOLED") display device 102 having a 2Tr-1 Cap structure, which includes two TFTs, for example, a switching TFT 10 and a driving TFT 20, and a capacitor 80 in each pixel. However, the second exemplary embodiment is not limited to the aforementioned structure. For example, the OLED display device 102 may include three or more TFTs and two or more capacitors in each pixel, and may further include additional wirings to have various suitable structures. Herein, the term "pixel" refers to the smallest unit for displaying an image, and the OLED display device 102 displays an image utilizing a plurality of pixels.

Each of the pixels includes the switching TFT 10, the driving TFT 20, the capacitor 80, and the OLED 310. Herein, the switching TFT 10, the driving TFT 20, and the capacitor 80 may be collectively referred to as the driving unit 230. In addition, a gate line 251 is disposed along one direction, and a data line 271 and a common power line 272 insulated from and intersecting (crossing) the gate line 251 are disposed on the driving unit 230. Herein, each pixel may be defined by the gate line 251, the data line 271, and the common power line 272, but it is not limited thereto. The pixel may also be defined by a pixel defining layer (PDL) and/or a light blocking layer.

The OLED 310 includes a first electrode 311, an organic light emitting layer 312 formed on the first electrode 311, and a second electrode 313 formed on the organic light emitting layer 312. The organic light emitting layer 312 includes or is formed of a low-molecular weight organic material or a high-molecular weight organic material. Holes and electrons are injected to the organic light emitting layer 312 from the first electrode 311 and the second electrode 313, respectively. The injected holes and electrons are combined with each other to form an exciton, and light is emitted by energy generated when the exciton falls from an excited state to a ground state.

The capacitor 80 includes a pair of capacitor plates 258 and 278 with an insulating interlayer 260 interposed therebetween. Herein, the insulating interlayer 260 may include a dielectric material. Capacitance of the capacitor 80 is determined by electric charges accumulated in the capacitor 80 and voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. The semiconductor layers 231 and 232 and the gate electrodes 252 and 255 are insulated from one another by a gate insulating layer 240.

The switching TFT 10 may function as a switching element which selects a pixel to perform light emission. The switching gate electrode 252 is connected to the gate line 251, and the switching source electrode 273 is connected to the data line 271. The switching drain electrode 274 is spaced apart from the switching source electrode 273 and connected to one of the capacitor plates 258 and 278.

The driving TFT 20 may apply a driving power to the first electrode 311, which serves as a pixel electrode, so as to allow the organic light emitting layer 312 of the OLED 310 in a selected pixel to emit light. The driving gate electrode 255 is connected to the one of the capacitor plates 258 that is connected to the switching drain electrode 274. The driving source electrode 276 and the other of the capacitor plates 278 are each connected to the common power line 272. The driving drain electrode 277 is connected to the first electrode 311, which is a pixel electrode of the OLED 310, through a drain contact hole defined in a planarization layer 265.

With the above-described structure, the switching TFT 10 may be operated by a gate voltage applied to the gate line 251, and may function to transmit a data voltage applied to the data line 271 to the driving TFT 20. A voltage equivalent to a difference between a common voltage applied from the common power line 272 to the driving TFT 20 and the data voltage transmitted from the switching TFT 10 may be stored in the capacitor 80, and a current corresponding to the voltage stored in the capacitor 80 may flow to the OLED 310 through the driving TFT 20, such that the OLED 310 may emit light.

According to the second exemplary embodiment, the first electrode 311 may be formed as a reflective layer and the second electrode 313 may be formed as a transflective (e.g., transmissive or semi-transmissive) layer. Accordingly, light generated from the organic light emitting layer 312 may be emitted through the second electrode 313. That is, the OLED display device 102 according to the second exemplary embodiment may be provided as a top-emission OLED.

At least one of a hole injection layer (HIL) and a hole transporting layer (HTL) may further be disposed between the first electrode 311 and the organic light emitting layer 312. Further, at least one of an electron transporting layer (ETL) and an electron injection layer (EIL) may be disposed between the organic light emitting layer 312 and the second electrode 313.

The pixel defining layer 290 has an aperture. The aperture of the pixel defining layer 290 exposes a portion of the first electrode 311. The first electrode 311, the organic light emitting layer 312, and the second electrode 313 are sequentially stacked in the aperture of the pixel defining layer 290. Herein, the second electrode 313 may be formed on the organic light emitting layer 312 and also on the pixel defining layer 290. Meanwhile, the HIL, HTL, ETL, and EIL may be disposed between the pixel defining layer 290 and the second electrode 313. The OLED 310 may generate light by the organic light emitting layer 312 disposed in the aperture of the pixel defining layer 290. Accordingly, the pixel defining layer 290 may define an emissive area.

A passivation layer 280 is disposed on the second electrode 313. The passivation layer 280 is to (e.g., configured to) protect the OLED 310 from an external environment. The passivation layer 280 may also be referred to as a capping layer.

The encapsulation substrate 212 is disposed on the passivation layer 280. The encapsulation substrate 212 may serve to encapsulate the OLED 310, along with the substrate 211. In order to encapsulate the OLED 310, a sealant may be disposed at an edge portion between the substrate 211 and the encapsulation substrate 212.

The encapsulation substrate 212 may include or be formed of an insulating material selected from glass, quartz, ceramic, plastic and/or the like, as those forming the substrate 211. Air or an inert gas may be filled in a space 360 between the passivation layer 280 and the encapsulation substrate 212.

A portion from the substrate 211 to the encapsulation substrate 212 is referred to as the display panel 110.

The polarizer 120 is disposed on the display panel 110 so as to reduce or prevent the ambient light reflection. In more detail, the polarizer 120 is disposed on the encapsulation substrate 212 corresponding to the display area of the display panel 110. However, the polarizer 120 may be omitted (e.g., may not be included).

The adhesive layer 150 is disposed on the display panel 110 and the polarizer 120. The window 130 is disposed on the adhesive layer 150.

Hereinafter, the window 130 and the adhesive layer 150 will be described further with reference to FIGS. 1 and 4.

Figure 4:
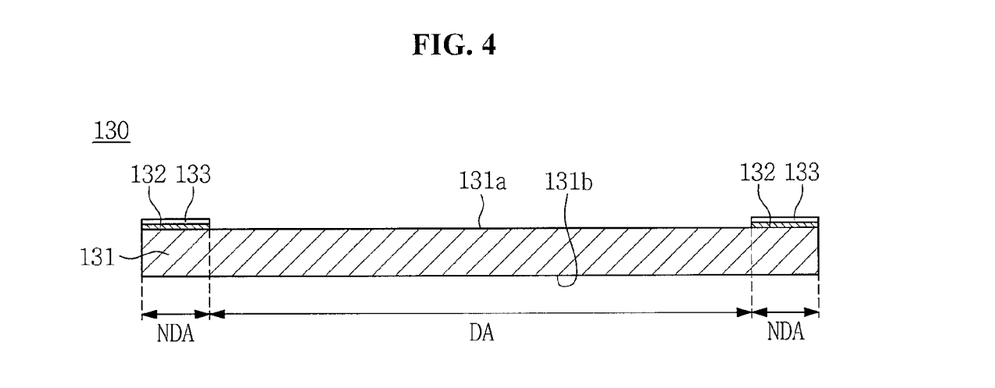
FIG. 4 is a cross-sectional view illustrating a window.

FIG. 4 is a cross-sectional view illustrating the window 130. The window 130 includes a transparent substrate 131 having a display area DA and a non-display area NDA, a light blocking layer 132 disposed in the non-display area NDA of the transparent substrate 131, and a metal layer 133 disposed in the non-display area NDA of the transparent substrate 131 and contacting the adhesive layer 150 (once the window is attached to the display panel 110).

According to the second exemplary embodiment, the transparent substrate 131 may include a transparent material such as glass, quartz, ceramic, plastic and/or the like. The transparent substrate 131, for example, may include or be formed of tempered glass.

The display area DA of the transparent substrate 131 is a transmissive area through which light is transmitted, and the non-display area NDA is a light blocking area in which light is blocked. That is, the non-display area NDA corresponds to an area of the transparent substrate 131 on which the light blocking layer 132 is disposed, and the display area DA corresponds to an area of the transparent substrate 131 on which the light blocking layer 132 is absent. The non-display area NDA corresponds to a bezel area of the OLED display device 102.

The light blocking layer 132 may be disposed on a first surface 131*a* disposed toward (to face) the display panel 110 among surfaces of the transparent substrate 131, and alternatively, may be disposed on a second surface 131*b* disposed toward an opposite direction (to face away) from the display panel 110. According to the first exemplary embodiment, the light blocking layer 132 is disposed on the first surface 131*a* of the transparent substrate 131 disposed toward (to face) the display panel 110.

The light blocking layer 132 may be formed in a method known in the pertinent art utilizing a light blocking material known in the pertinent art. The light blocking layer 132 may also be referred to as a black matrix (BM).

The metal layer 133 is disposed in the non-display area NDA of the transparent substrate 131 and contacts the adhesive layer 150. According to the first exemplary embodiment, as the light blocking layer 132 is disposed on the first surface 131*a* of the transparent substrate 131 disposed toward the display panel 110, the metal layer 133 is disposed on the light blocking layer 132.

The metal layer 133 includes a metal element. The metal element serves as a catalyst which facilitates the initiation of the polymerization reaction of the metal reactive initiator. That is, the metal reactive initiator may be activated by contacting the metal element. The metal layer 133 may include, for example, at least one metal element of (at least one metal element selected from) iron (Fe) and copper (Cu).

The metal layer 133 may be formed by deposition of the metal element on the light blocking layer 132. In an alternative exemplary embodiment, the metal layer 133 may be formed by coating a coating composition including the metal element on the light blocking layer 132 and curing the coating composition. The metal layer 133 formed in such a manner includes a coating resin, that is, a resin component, and a metal element dispersed in the coating resin.

The adhesive layer 150 is formed through curing of the adhesive composition according to the first exemplary embodiment. The adhesive layer 150 includes an adhesive polymer resin formed through polymerization and cross-linking of the monomer, the oligomer, and the plasticizer forming the adhesive composition, and the unreacted photo-initiator component and anaerobic-initiator component dispersed in the adhesive polymer resin.

The adhesive composition disposed in a lower portion of the display area DA of the transparent substrate 131 is photo-cured to form a photo-curing portion 150a, and the adhesive composition disposed in a lower portion of the non-display area NDA is anaerobically cured by the metal reactive initiator to form an anaerobic-curing portion 150b. Accordingly, the adhesive layer 150 includes the photo-curing portion 150a corresponding to the display area DA of the transparent substrate 131 and the anaerobic-curing portion 150b corresponding to the non-display area NDA of the transparent substrate 131.

The adhesive polymer resin of the photo-curing portion 150a is formed by photo-polymerization by the photo-radical initiator. Accordingly, the adhesive polymer resin of the photo-curing portion 150a includes a polymer moiety and a radical group of the photo-radical initiator bonded to the polymer moiety. In addition, the photo-curing portion 150a includes the adhesive polymer resin and the unreacted anaerobic-initiator component dispersed in the adhesive polymer resin.

The adhesive polymer resin of the anaerobic-curing portion 150b is formed by anaerobic-curing reaction by the metal reactive initiator. Accordingly, the adhesive polymer resin of the anaerobic-curing portion 150b includes a polymer moiety and a radical group of the metal reactive initiator bonded to the polymer moiety. In addition, the anaerobic-curing portion 150b includes the adhesive polymer resin and the unreacted photo-initiator component dispersed in the adhesive polymer resin.

Hereinafter, a method of manufacturing the OLED display device 102 according to the second exemplary embodiment will be described with reference to FIGS. 5A to 5D.

FIGS. 5A to 5D are views illustrating a process of attaching the window 130 to the display panel 110.

Figure 5A:
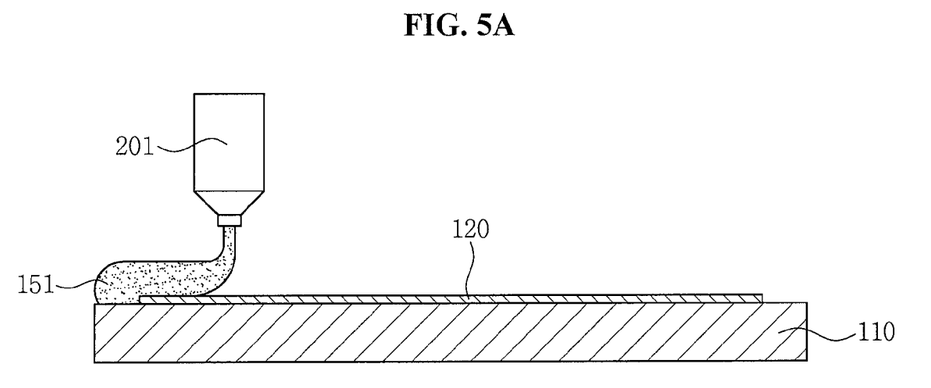
FIGS. 5A to 5D are views illustrating a process of attaching the window to a display panel.

In reference to FIG. 5A, the adhesive composition 151 according to the first exemplary embodiment is coated on a display surface of the display panel 110 to which the polarizer 120 is attached. Herein, a slit coater 201 may be utilized so as to coat the adhesive composition 151. The polarizer 120 may be omitted (e.g., may not be included).

Figure 5B:
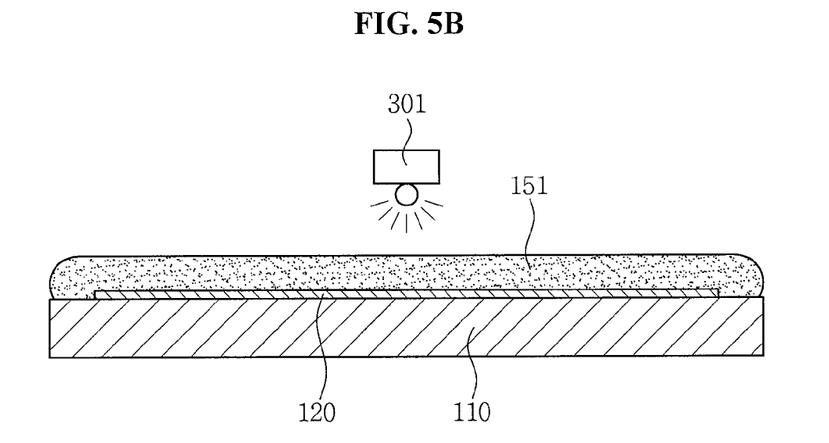

In reference to FIG. 5B, the adhesive composition 151 is first cured by a first light source 301 (to manufacture a firstly cured adhesive composition). The first light source 301 may utilize an LED (light emitting diode) lamp that emits UV ray having a center wavelength of from about 340 nm to about 385 nm. Such a first light source 301 may also be referred to as a long-wavelength light source. Meanwhile, a short-wavelength light source that emits light having a wavelength of about 300 nm or less may also be utilized as the first light source 301.

The first curing cures a surface of the adhesive composition 151. Accordingly, the first curing is also referred to as pre-curing. The first curing may be omitted (e.g., the first curing may not be conducted).

Through the first curing, the surface of the adhesive composition 151 is cured to form a coating film. While fluidity of the adhesive composition 151 (on the surface) is suppressed due to the coating film, fluidity of an inner portion of the adhesive composition 151 may be maintained, and thereby workability may be enhanced.

Figure 5C:
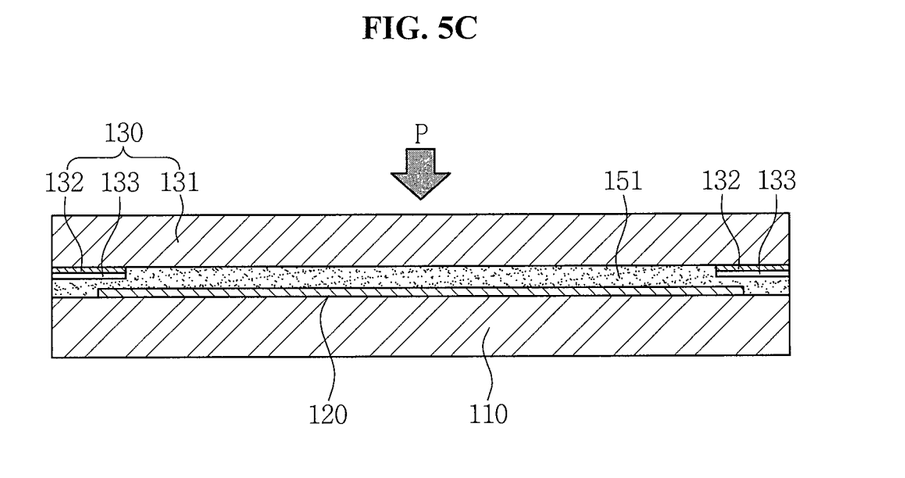

In reference to FIG. 5C, the window 130 is disposed on the firstly cured adhesive composition (e.g., the adhesive composition that has been through the first curing) 151.

The window 130 includes the transparent substrate 131 having the display area DA and the non-display area NDA, the light blocking layer 132 in the non-display area NDA of the transparent substrate 131, and the metal layer 133 on the light blocking layer 132 (refer to FIG. 4).

In this regard, the window 130 is disposed so that the metal layer 133 of the window 130 contacts the adhesive composition 151. Subsequently, a set or predetermined pressure (P) is applied to the window 130, such that the window 130 is compressed to the display panel 110.

Figure 5D:
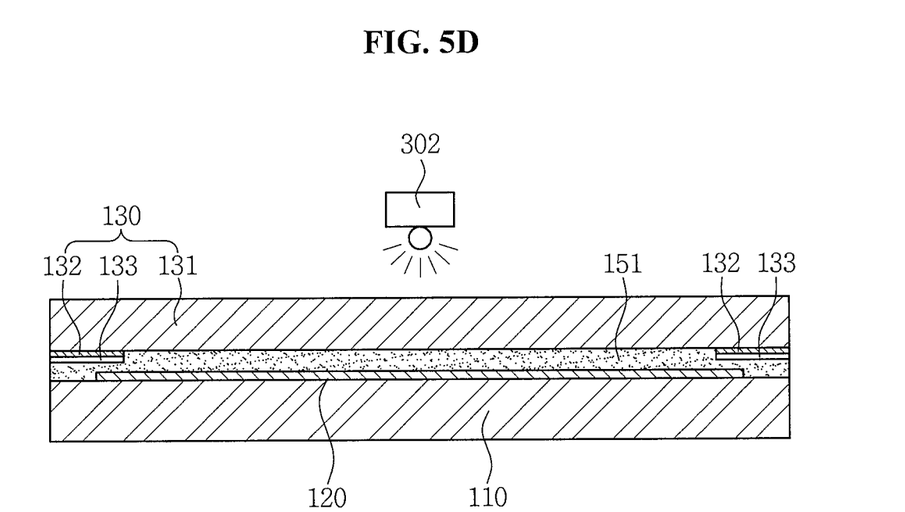

In reference to FIG. 5D, light is irradiated to the window 130 by a second light source 302, and thus the firstly cured adhesive composition 151 is secondly cured. The second curing is referred to as the main curing.

The second light source 302 may utilize, for example, a metal halide lamp that has a relatively wide wavelength range. In the second curing, for example, light having an intensity of about 100 mW to about 200 mW may be utilized.

In such an embodiment, light is irradiated to the adhesive composition 151 in the lower portion of the display area DA of the transparent substrate 131. Through light irradiation, the photo initiator component in the lower portion of the display area DA is activated, and the reactive groups of the adhesive composition 151 not having participated (not consumed) in the first curing may participate in polymerization reaction. Accordingly, the adhesive composition in the lower portion of the display area DA is photo-cured, such that the photo-curing portion 150a is formed.

Meanwhile, as light may not be transmitted through the light blocking layer 132, the adhesive composition 151 in the lower portion of the non-display area NDA of the transparent substrate 131 is not photo-cured. However, as the metal layer 133 is disposed on the light blocking layer 132, the adhesive composition in the lower portion of the non-display area NDA is anaerobically cured by the metal reactive initiator, thus forming the anaerobic-curing portion 150b.

Accordingly, the photo-curing portion 150a corresponding to the display area DA of the transparent substrate 131 and the anaerobic-curing portion 150b corresponding to the non-display area NDA of the transparent substrate 131 may be formed.

Since the metal layer is absent in the display area DA of the transparent substrate 131, the adhesive composition in the lower portion of the display area DA is not anaerobically cured, and thus the anaerobic-initiator component remains therein. Accordingly, the photo-curing portion 150a includes the adhesive polymer resin and the anaerobic-initiator component dispersed in the adhesive polymer resin.

Meanwhile, as light may not be transmitted through the non-display area NDA of the transparent substrate 131, the adhesive composition in the lower portion of the non-display area NDA of the transparent substrate 131 is not photo-cured, and the photo-initiator component is not consumed. Accordingly, the anaerobic-curing portion 150b includes the adhesive polymer resin and the unreacted photo-initiator component dispersed in the adhesive polymer resin.

As set forth above, according to exemplary embodiments, the adhesive composition includes both the photo-initiator component and the anaerobic-initiator component, and thereby the lower portion of the light blocking layer in the window to which light may not be adequately irradiated may be readily cured. Further, according to exemplary embodiments, the adhesive composition includes the photo-base generator, and thus capable of capturing and consuming an acid group generated in the process of anaerobic curing. As such, the adhesive layer including or being formed of the adhesive composition according to exemplary embodiments is capable of having excellent adhesion.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112, first paragraph, or 35 U.S.C. §112(a), and 35 U.S.C. §132(a).

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting, with the true scope and spirit being indicated by the following claims, and equivalents thereof. Various features of the above described and other embodiments can be mixed and matched in any manner, to produce further embodiments consistent with the invention.

What is claimed is:

1. An adhesive composition comprising:
a binder component;
a photo-initiator component; and
an anaerobic-initiator component,
the binder component comprising:
a monomer in an amount of about 10 wt % to about 60 wt %;
an oligomer in an amount of about 20 wt % to about 80 wt %; and
a plasticizer in an amount of about 5 wt % to about 20 wt %, with respect to a total weight of the adhesive composition,
the photo-initiator component comprising:
a photo-radical initiator in an amount of about 0.3 wt % to about 5 wt %; and
a photo-base generator (PBG) in an amount of about 0.2 wt % to about 2 wt %, with respect to the total weight of the adhesive composition, and
the anaerobic-initiator component comprising:
a metal reactive initiator in an amount of about 0.1 wt % to about 2 wt %;
an accelerator in an amount of about 0.2 wt % to about 2 wt %; and
an inhibitor in an amount of about 0.1 wt % to about 1 wt %, with respect to the total weight of the adhesive composition.

2. The adhesive composition of claim 1, wherein the monomer comprises at least one selected from the group consisting of: nonylphenyl carbitol acrylate, 2-hydroxy-3-phenoxypropyl acrylate, 2-ethylhexyl carbitol acrylate, 2-hydroxyethyl acrylate, N-vinyl pyrrolidone, 1,6-hexanedioldi(meth)acrylate, ethylene glycol di(meth)acrylate, neopentyl glycol di(meth)acrylate, triethylene glycol di(meth)acrylate, bis(acryloyl oxyethyl) ether, 3-methylpentanediol di(meth)acrylate, ethyl hexyl oxetane, trimethylolpropane tri(meth)acrylate, ethoxylated trimethylolpropane tri(meth)acrylate, propoxylated trimethylolpropane tri(meth)acrylate, pentaerythritol tri(meth)acrylate, pentaerythritol tetra(meth)acrylate, dipentaerythritol penta(meth)acrylate, ethoxylated dipentaerythritol hexa(meth)acrylate, propoxylated dipentaerythritol hexa(meth)acrylate, dipentaerythritol hexa(meth)acrylate, isobornyl acrylate, n-octyl acrylate, tetrahydrofurfuryl acrylate, and 4-hydroxybutyl acrylate.

3. The adhesive composition of claim 1, wherein the monomer comprises a compound having a cyclic ether group.

4. The adhesive composition of claim 1, wherein the oligomer comprises at least one selected from the group consisting of: urethane (meth) acrylate and ester (meth) acrylate, each having a weight-average molecular weight (Mw) of from about 5,000 to about 50,000.

5. The adhesive composition of claim 1, wherein the plasticizer comprises at least one selected from the group consisting of: di-butyl-phthalate (DBP), di-2-ethylhexyl phthalate (DOP), di-isononyl phthalate (DINP), di-isodecyl phthalate (DIDP), and butyl benzyl phthalate (BBP).

6. The adhesive composition of claim 1, wherein the photo-base generator reacts to light having a wavelength of from about 240 nm to about 385 nm to thereby generate a basic group.

7. The adhesive composition of claim 1, wherein the photo-base generator comprises at least one selected from the group consisting of: a carbamate compound, an α-amino ketone compound, a quaternary ammonium compound, an aminocyclopropenone compound, an o-acyloxime compound, and 2-(9-oxoxanthen-2-yl) propionic acid 1,5,7-triazabicyclo [4,4,0] dec-5-ene salt.

8. The adhesive composition of claim 1, wherein the accelerator comprises: saccharin and N,N-dimethyl-p-toluidine (DMPT).

9. The adhesive composition of claim 1, wherein the metal reactive initiator comprises at least one selected from the group consisting of: cumene hydroperoxide, t-butyl hydroperoxide, di-t-butyl hydroperoxide, methylethylketone peroxide, dicumyl peroxide, 2,5-dimethyl-hexyl-2,5-dihydro peroxide, diisopropylbenzene hydroperoxide, t-butyl benzoate, and t-butyl peroxyacetate.

10. The adhesive composition of claim 1, wherein the inhibitor comprises at least one selected from the group consisting of: 1,2,3,4-tetrahydroquinoline, hydroquinone, methyl hydroquinone, hydroquinone monomethyl ether, naphthoquinone, penanthraquinone, anthraquinone, benzoquinone, catechol, t-butylcatechol, 2,6-di-t-butyl-p-cresol, 2,6-di-t-butyl-4-methylphenol, phenothiazine, picrin acid phenothiazine, and hydroxy diphenylamine.

11. The adhesive composition of claim 1, wherein the anaerobic-initiator component further comprises a chelate in an amount of about 0.05 wt % to about 0.5 wt % with respect to the total weight of the adhesive composition.

12. A display device comprising:
a display panel;
an adhesive layer on the display panel; and
a window on the adhesive layer,
wherein the adhesive layer comprises an adhesive polymer resin, a photo-initiator component, and an anaerobic-initiator component,
the photo-initiator component comprises a photo-radical initiator and a photo-base generator,
the anaerobic-initiator component comprises a metal reactive initiator, an accelerator, and an inhibitor, and
the window comprises:
a transparent substrate having a display area and a non-display area;
a light blocking layer in the non-display area of the transparent substrate; and
a metal layer in the non-display area of the transparent substrate, the metal layer contacting the adhesive layer,
wherein the adhesive layer comprises a photo-curing portion corresponding to the display area of the transparent substrate and an anaerobic-curing portion corresponding to the non-display area of the transparent substrate.

13. The display device of claim 12, wherein the metal layer is on the light blocking layer.

14. The display device of claim 12, wherein the metal layer comprises at least one of iron (Fe) and copper (Cu).

15. The display device of claim 12, wherein the metal layer comprises a coating resin and a metal element dispersed in the coating resin.

16. The display device of claim 12, wherein the photo-curing portion comprises the adhesive polymer resin and the anaerobic-initiator component dispersed in the adhesive polymer resin.

17. The display device of claim 16, wherein the adhesive polymer resin of the photo-curing portion comprises a polymer moiety and a radical group of the photo-radical initiator bonded to the polymer moiety.

18. The display device of claim 12, wherein the anaerobic-curing portion comprises the adhesive polymer resin and the photo-initiator component dispersed in the adhesive polymer resin.

19. The display device of claim 18, wherein the adhesive polymer resin of the anaerobic-curing portion comprises a polymer moiety and a radical group of the metal reactive initiator bonded to the polymer moiety.

* * * * *